United States Patent
Yeh et al.

(10) Patent No.: US 10,096,578 B1
(45) Date of Patent: Oct. 9, 2018

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chang-Lin Yeh, Kaohsiung (TW); Yu-Chang Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/643,470

(22) Filed: Jul. 6, 2017

(51) Int. Cl.
| | |
|---|---|
| *H01L 23/053* | (2006.01) |
| *H01L 23/34* | (2006.01) |
| *H01L 25/065* | (2006.01) |
| *H01L 23/498* | (2006.01) |
| *H01L 23/00* | (2006.01) |

(52) U.S. Cl.
CPC .... *H01L 25/0657* (2013.01); *H01L 23/49811* (2013.01); *H01L 23/49833* (2013.01); *H01L 24/16* (2013.01); *H01L 24/32* (2013.01); *H01L 24/73* (2013.01); *H01L 23/49827* (2013.01); *H01L 2224/16225* (2013.01); *H01L 2224/32225* (2013.01); *H01L 2224/73253* (2013.01); *H01L 2225/0652* (2013.01); *H01L 2225/06517* (2013.01); *H01L 2225/06572* (2013.01); *H01L 2924/10156* (2013.01); *H01L 2924/1816* (2013.01); *H01L 2924/3512* (2013.01)

(58) Field of Classification Search
CPC .............. H01L 25/043; H01L 25/0652; H01L 25/0657; H01L 25/117; H01L 24/04; H01L 24/07; H01L 24/08; H01L 24/23; H01L 23/485; H01L 23/49833; H01L 2924/1811; H01L 2924/1815; H01L 2924/1816
USPC ........ 257/686, 687, 700, 723; 438/106, 107, 438/109
See application file for complete search history.

(56) References Cited

U.S. PATENT DOCUMENTS 9,190,367 B1 * 11/2015 Liao .................. H01L 24/97
2013/0328220 A1    12/2013 Lee et al.

* cited by examiner

*Primary Examiner* — Hsien Ming Lee
(74) *Attorney, Agent, or Firm* — Foley & Lardner LLP; Cliff Z. Liu

(57) ABSTRACT

A semiconductor package device includes a substrate, an electronic component disposed on the substrate, and a package body. The electronic component has a first surface adjacent to the substrate and a second surface opposite to the first surface. The second surface has at least five edges, and the package body encapsulates the electronic component and exposes the second surface of the electronic component.

23 Claims, 14 Drawing Sheets

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. The present disclosure relates to a semiconductor package device including a double-sided molding structure and a method of manufacturing the same.

2. Description of the Related Art

In comparative double-sided semiconductor package devices, to facilitate heat dissipation in the semiconductor package device, a backside of a semiconductor device (e.g. a die) can be exposed from an encapsulation layer. However, a coefficient of thermal expansion (CTE) mismatch between the die and the encapsulation layer may induce stress which can lead to effects that are undesirable in some implementations, such as, for example, warpage of the semiconductor package device, damage on the encapsulation layer and the like. Such phenomenon may occur, for example, at a boundary between the die and the encapsulation layer. Cracking or other damage can occur in the encapsulation layer close to a corner of the die.

SUMMARY

In one aspect, a semiconductor package device includes a substrate, an electronic component disposed on the substrate, and a package body. The electronic component has a first surface adjacent to the substrate and a second surface opposite to the first surface. The second surface has at least five edges, and the package body encapsulates the electronic component and exposes the second surface of the electronic component.

In another aspect, a semiconductor package device includes a substrate, an electronic component disposed on the substrate, and a package body. The electronic component has a first surface adjacent to the substrate and a second surface opposite to the first surface. At least one angle defined by two adjacent edges of the second surface of the electronic component is greater than about 90 degrees. The package body encapsulates the electronic component and exposes the second surface of the electronic component.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
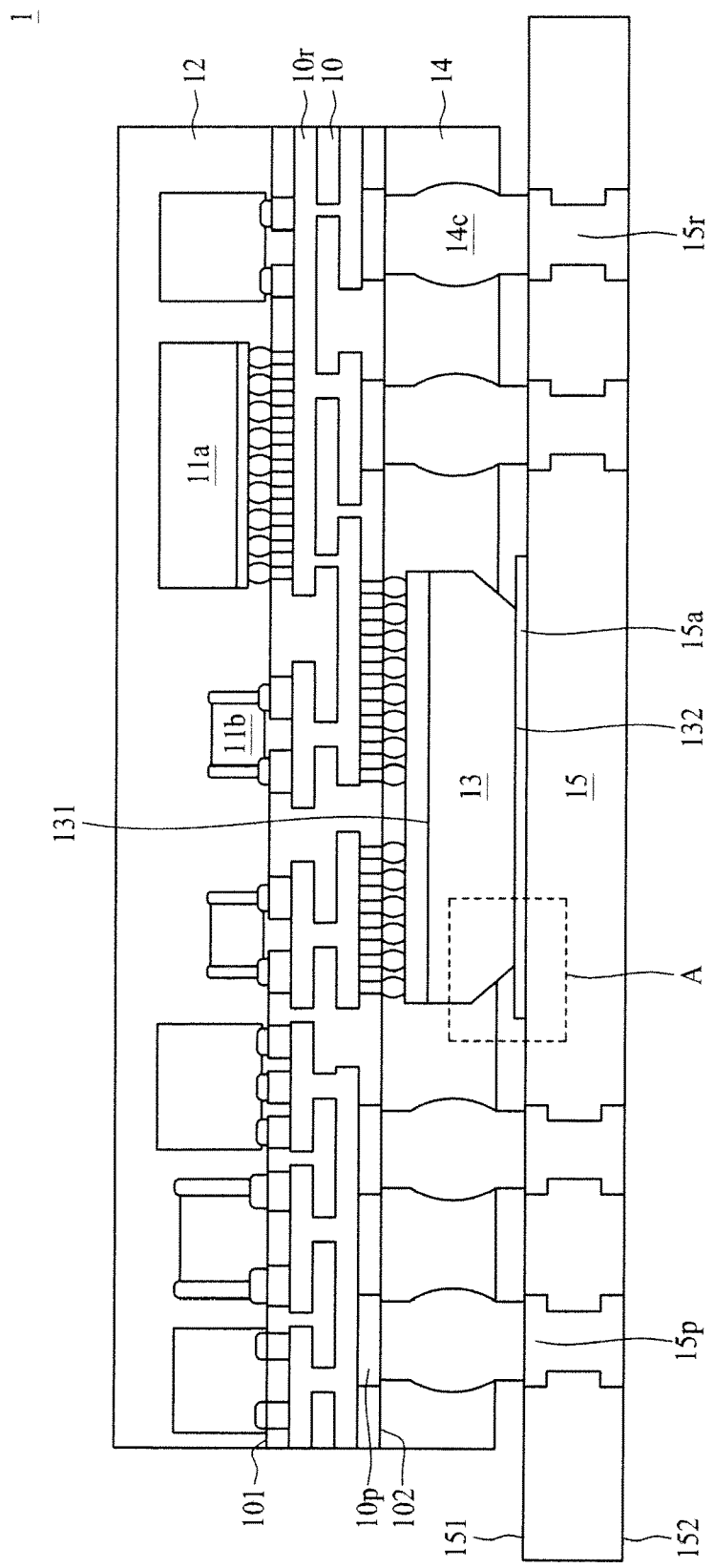
FIG. 1A illustrates a cross-sectional view of some embodiments of a semiconductor package device in accordance with a first aspect of the present disclosure.

FIG. 1A illustrates a cross-sectional view of some embodiments of a semiconductor package device 1 in accordance with a first aspect of the present disclosure. The semiconductor package device 1 includes a substrate 10, electronic components 11a, 11b, and 13, package bodies 12, 14 and a carrier 15.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure 10r, such as a redistribution layer (RDL) or a grounding element. The substrate 10 has a surface 101 and a surface 102 opposite to the surface 101. The surface 101 of the substrate 10 is referred to herein as a top surface or a first surface, and the surface 102 of the substrate is referred to herein as a bottom surface or a second surface.

The electronic components 11a, 11b are disposed on the top surface 101 of the substrate 10. The electronic component 11a may include an active component, such as an integrated circuit (IC) chip or a die. The electronic component 11b may include a passive electronic component, such as a capacitor, a resistor or an inductor. Each or either of the electronic components 11a, 11b may be electrically connected to one or more other electronic components (e.g.

another electronic component 11a or 11b) and/or to the substrate 10 (e.g., to the RDL). Such electrical connection may be attained by way of, for example, flip-chip or wire-bond techniques.

The package body 12 is disposed on the top surface 101 of the substrate 10 and covers or encapsulates the electronic components 11a, 11b. In some embodiments, the package body 12 includes an epoxy resin having fillers, a molding compound (e.g., an epoxy molding compound or other molding compound), a polyimide, a phenolic compound or material, a material with a silicone dispersed therein, or a combination thereof.

The electronic component 13 is disposed on the bottom surface 102 of the substrate 10. In some embodiments, the electronic component 13 may include an active component, such as an integrated circuit (IC) chip or a die. The electronic component 13 may be electrically connected to at least one of the electronic components 11a, 11b through the interconnection structure 10r within the substrate 10. The electronic component 13 has an active surface 131 and a back surface 132 opposite to the active surface 131. The active surface 131 may face the bottom surface 102.

The package body 14 is disposed on the bottom surface 102 of the substrate 10 and covers or encapsulates a first portion of the electronic component 13, and exposes a second portion of the electronic component 13. In some embodiments, the package body 14 includes an epoxy resin having fillers, a molding compound (e.g., an epoxy molding compound or other molding compound), a polyimide, a phenolic compound or material, a material with a silicone dispersed therein, or a combination thereof.

The carrier 15 may include, for example, a printed circuit board, such as a paper-based copper foil laminate, a composite copper foil laminate, or a polymer-impregnated glass-fiber-based copper foil laminate. The carrier 15 has a surface 151 and a surface 152 opposite to the surface 151. The surface 151 of the carrier 15 is referred to herein as a top surface or a first surface, and the surface 152 of the carrier 15 is referred to herein as a bottom surface or a second surface. The carrier 15 may include an interconnection structure 15r (e.g., an interconnection structure including one or more through vias) penetrating the carrier 15 and electrically connecting the top surface 151 of the carrier 15 to the bottom surface 152 of the carrier 15.

One or more conductive pads 15p are disposed on the top surface 151 of the carrier 15. One or more conductive pads 10p are disposed on the bottom surface 102 of the substrate 10. A plurality of interconnection structures 14c penetrate the package body 14 and electrically connect the conductive pads 10p on the bottom surface 102 of the substrate 10 to the conductive pads 15p on the top surface 151 of the carrier 15.

A thermal interface material (TIM) 15a is disposed between the back surface 132 of the electronic component 13 and the top surface 151 of the carrier 15. The TIM 15 contacts the back surface 132 of the electronic component and the top surface 151 of the carrier 15, and can provide for enhanced heat dissipation for the electronic component 13. In some embodiments, the thermal interface material 15a can be replaced by solder or other materials suitable for heat dissipation (e.g. thermally conductive materials, such as materials including a metal).

Figure 1B:
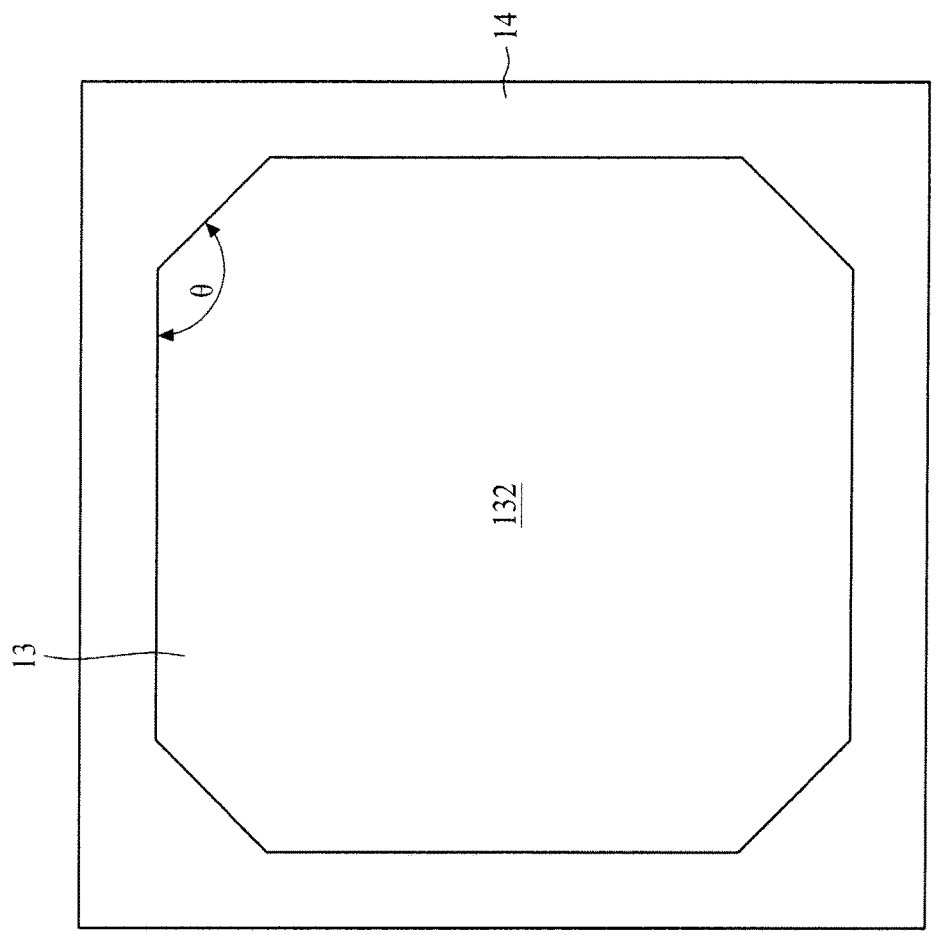
FIG. 1B illustrates a bottom view of the semiconductor package device shown in FIG. 1A in accordance with some embodiments of the present disclosure.

FIG. 1B illustrates a bottom view of the electronic component 13 of the semiconductor package device 1 from the back surface 132 of the electronic component 13 in accordance with some embodiments of the present disclosure.

As shown in FIG. 1B, the back surface 132 of the electronic component 13 has eight edges. Each internal angle (θ) of the electronic component 13 defined by two adjacent edges of the back surface 132 of the electronic component 13 is greater than about 90 degrees. In other words, each internal angle (θ) of a corner of the package body 14 defined by two adjacent edges of the back surface 132 of the electronic component 13 is greater than about 90 degrees. For example, the angle is about 100 degrees or greater, about 110 degrees or greater, about 120 degrees or greater, or about 135 degrees or greater. In some embodiments, the back surface 132 of the electronic component 13 has any suitable number of edges and each internal angle defined by any two of the adjacent edges is greater than about 90 degrees.

Figure 1C:
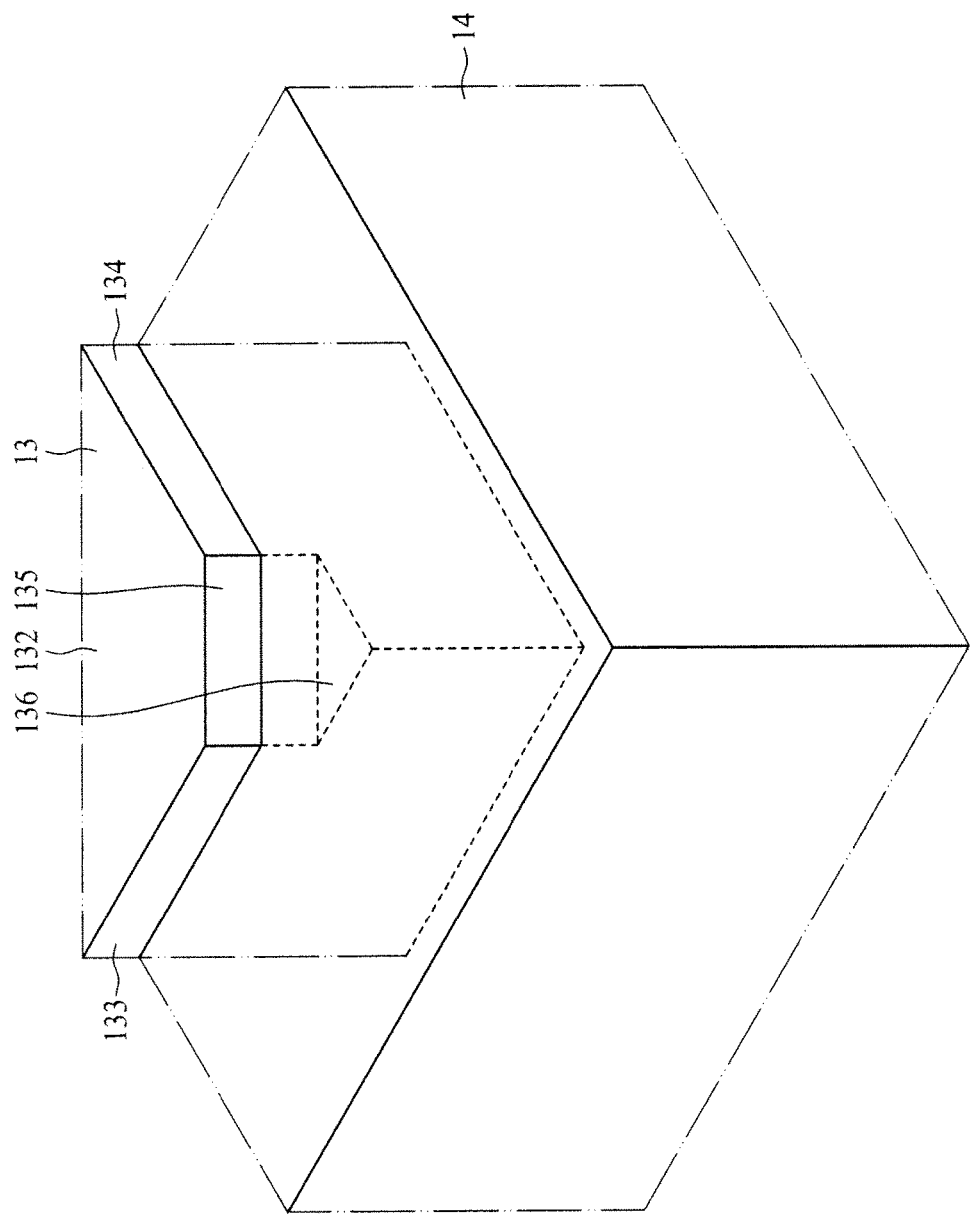
FIG. 1C illustrates a perspective view of an enlarged portion of the semiconductor package device shown in FIG. 1A in accordance with some embodiments of the present disclosure.

FIG. 1C illustrates a perspective view of an enlarged portion A (identified by a dotted line in FIG. 1A) of the semiconductor package device 1 in accordance with some embodiments of the present disclosure. FIG. 1C shows a corner of the electronic component 13.

As shown in FIG. 1C, in addition to the back surface 132, the electronic component 13 has surfaces 133, 134, 135 and 136. The surface 133 is adjacent to the back surface 132 and is substantially perpendicular to the back surface 132. The surface 134 is adjacent to the back surface 132 and is substantially perpendicular to the back surface 132. The surface 135 is adjacent to the back surface 132, is adjacent to and extends between the surface 133 and the surface 134, and is substantially perpendicular to the back surface 132. The surface 136 is adjacent to the surface 135 and is substantially parallel to the back surface 132. The surface 136 may be disposed on a plane substantially parallel to, and between, the back surface 132 and the bottom surface 102 of the substrate 10. In some embodiments, the surfaces 135 and 136 are formed (e.g. are exposed from the body of the electronic component 13) by removing a portion of the corner defined by the surfaces 132, 133 and 134. In some embodiments, the corner of the electronic component 13 may define a recess or a notch substantially in the shape of a prism (e.g. substantially in the shape of a triangular prism).

The package body 14 encapsulates or covers the surface 136 and exposes a portion of one or more of the surfaces 133, 134 and 135. For example, an exposed surface of the package body 14 is recessed relative to the back surface 132. In some embodiments, the package body 14 may encapsulate or cover the surface 133, 134, 135 and 136, such that the package body 14 is substantially coplanar with the back surface 132. In some embodiments, an internal angle of a corner of the package body 14 defined by the surfaces 133 and 135 and/or on defined by the surfaces 134 and 135 is greater than about 90 degrees.

As mentioned above, to facilitate heat dissipation in a semiconductor package device, a back surface of a semiconductor device (e.g. a die) can be exposed from an encapsulation layer. However, due to a CTE mismatch between the die and the encapsulation layer, stress can be concentrated at a corner of a back surface of the die (especially when an angle of the corner is less than or equal to about 90 degrees). Such stress concentration can lead to a crack in the encapsulation layer close to the corner of the die. For the embodiments depicted in FIG. 1A, FIG. 1B and FIG. 1C, the exposed back surface 132 of the electronic component 13 and the corner of the back surface 132 of the electronic component 13 having surfaces that define one or more angles greater than about 90 degrees can provide for a release or redistribution of stress in the package body 14 close to the corner of the electronic component 13, which can help to avoid cracking or other damage.

Figure 1D:
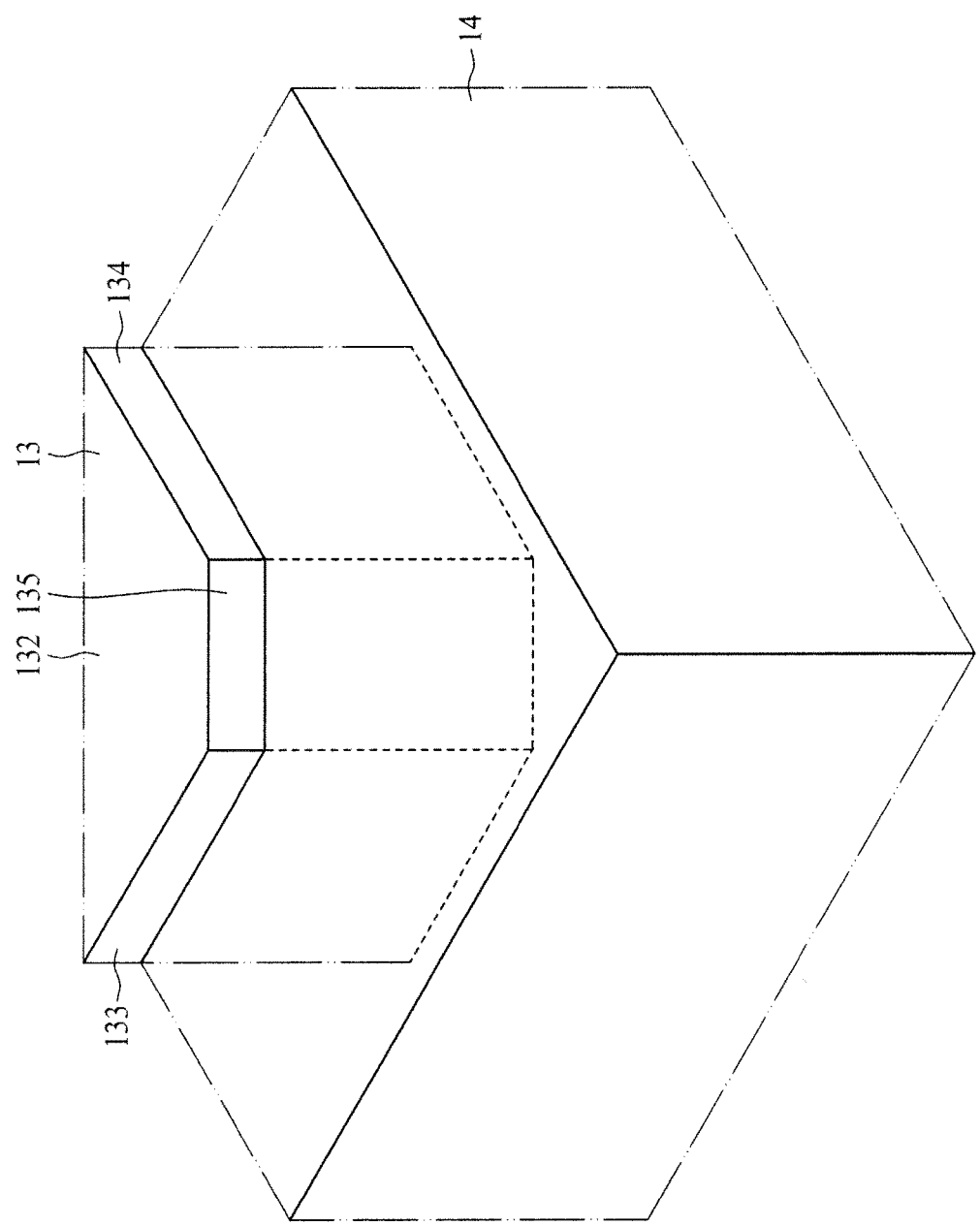
FIG. 1D illustrates a perspective view of an enlarged portion of the semiconductor package device shown in FIG. 1A in accordance with some embodiments of the present disclosure.

FIG. 1D illustrates a perspective view of the enlarged portion A of the semiconductor package device 1 in accordance with some embodiments of the present disclosure. FIG. 1D shows a corner of the electronic component 13. The structure shown in FIG. 1D is similar to that shown in FIG. 1C, in that the corner of the electronic component 13 may define a recess or a notch substantially in the shape of a prism (e.g. substantially in the shape of a triangular prism), except that a right angled extension at the corner defined by the surfaces 132, 133 and 134 is missing or removed. For example, the surface 135 extends from the back surface 132 to the active surface 131 of the electronic component 13. The structure shown in FIG. 1D does not have the surface 136 of the structure shown in FIG. 1C. In some embodiments, the surface 135 is substantially in the shape of a rectangle.

Figure 2A:
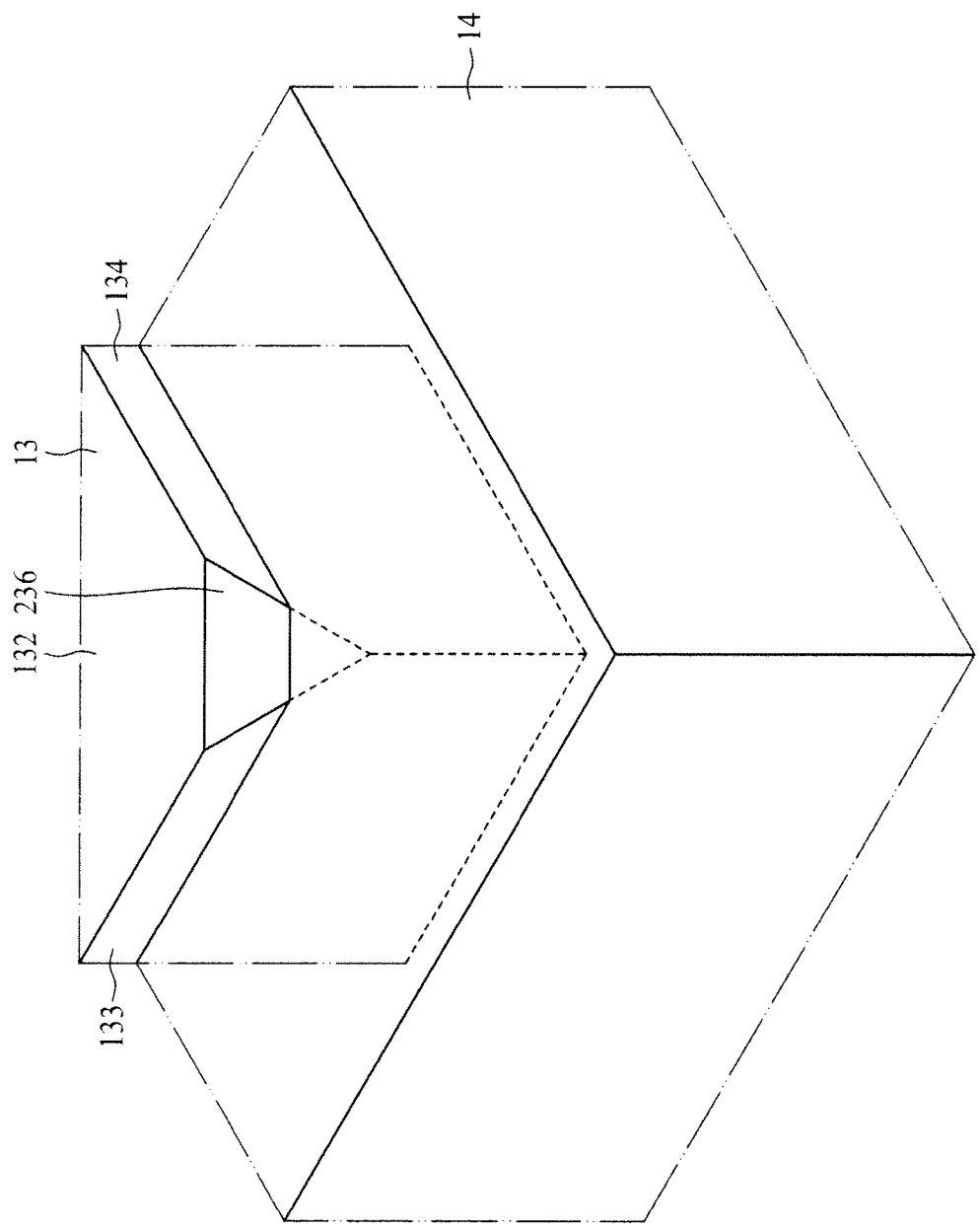
FIG. 2A illustrates a perspective view of an enlarged portion of the semiconductor package device shown in FIG. 1A in accordance with some embodiments of the present disclosure.

FIG. 2A illustrates a perspective view of an enlarged portion A of the semiconductor package device 1 in accordance with some embodiments of the present disclosure. FIG. 2A shows a corner of the electronic component 13.

As shown in FIG. 2A, in addition to the back surface 132, the electronic component 13 has surfaces 133, 134 and 236. The surface 133 is adjacent to the back surface 132 and is substantially perpendicular to the back surface 132. The surface 134 is adjacent to the back surface 132 and is substantially perpendicular to the back surface 132. The surface 236 is adjacent to the back surface 132, and is adjacent to and extends between the surface 133 and the surface 134. An internal angle of the corner of the electronic component 13 defined by the surface 236 and any of the surfaces 132, 133 and 134 is greater than about 90 degrees. In some embodiments, the surface 236 is substantially in the shape of a triangle. In some embodiments, the surface 236 is formed by removing a portion of the corner defined by the surfaces 132, 133 and 134.

The package body 14 exposes a portion of the surfaces 133, 134 and 236. For example, an exposed surface of the package body 14 is recessed relative to the back surface 132. In some embodiments, the package body 14 may encapsulate or cover the surface 133, 134 and 236, such that the package body 14 is substantially coplanar with the back surface 132. In some embodiments, an internal angle of the package body 14 defined by the surfaces 133 and 236 or defined by the surfaces 134 and 236 is greater than about 90 degrees.

Figure 2B:
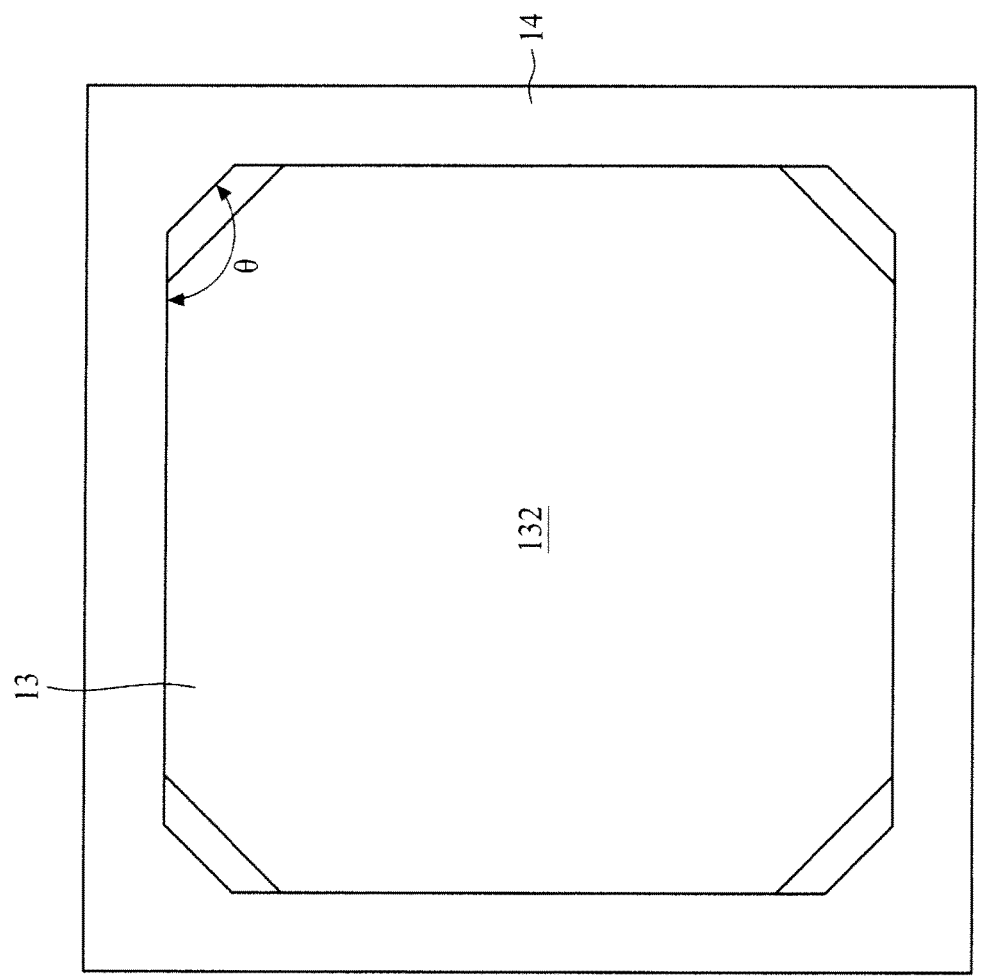
FIG. 2B illustrates a bottom view of the semiconductor package device shown in FIG. 1A in accordance with some embodiments of the present disclosure.

FIG. 2B illustrates a bottom view of the electronic component 13 of the semiconductor package device 1 from the back surface 132 of the electronic component 13 in accordance with some embodiments of the present disclosure.

As shown in FIG. 2B, the back surface 132 of the electronic component 13 has eight edges. Each internal angle ($\theta$) of the electronic component 13 defined by two adjacent edges of the back surface 132 of the electronic component 13 is greater than about 90 degrees. In other words, each internal angle ($\theta$) of a corner of the package body 14 defined by two adjacent edges of the back surface 132 of the electronic component 13 is greater than about 90 degrees. For example, the angle is about 100 degrees or greater, about 110 degrees or greater, about 120 degrees or greater, or about 135 degrees or greater. In some embodiments, the back surface 132 of the electronic component 13 has any suitable number of edges and each angle defined by any two of the adjacent edges is greater than about 90 degrees.

Figure 2C:
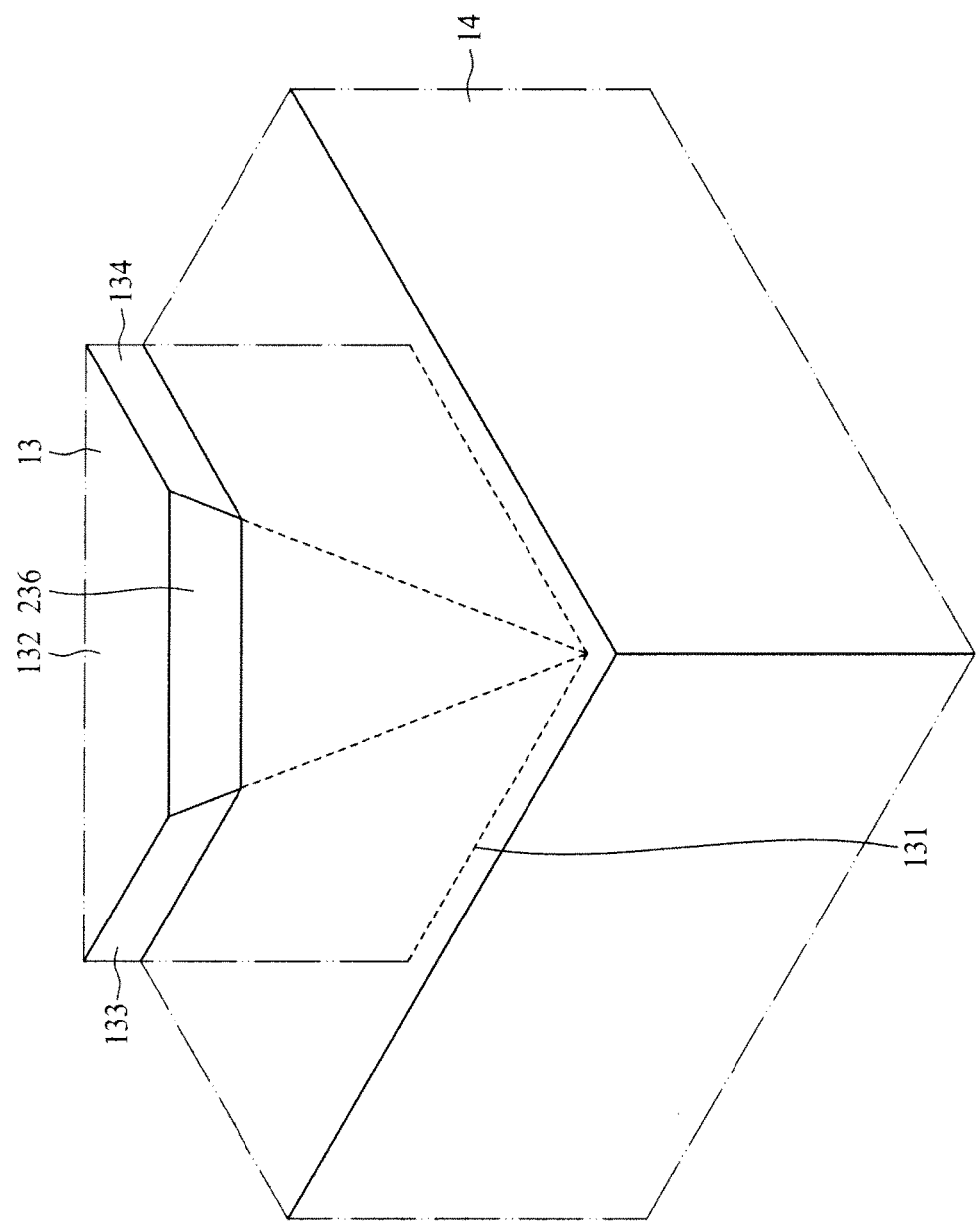
FIG. 2C illustrates a perspective view of an enlarged portion of the semiconductor package device shown in FIG. 1A in accordance with some embodiments of the present disclosure.

FIG. 2C illustrates a perspective view of an enlarged portion A of the semiconductor package device 1 in accordance with some embodiments of the present disclosure. FIG. 2C shows a corner of the electronic component 13. The structure shown in FIG. 2C is similar to that shown in FIG. 2A, except that it omits the lower portion of the corner of the electronic component 13, and the surface 236 extends from the back surface 132 to the active surface 131 of the electronic component 13.

For the embodiments depicted in FIGS. 2A, 2B and 2C, the exposed back surface 132 of the electronic component 13 and the corner of the back surface 132 of the electronic component 13 having surfaces that define one or more angles greater than about 90 degrees can provide for a release or redistribution of stress in the package body 14 close to the corner of the electronic component 13, which can help to avoid cracking or other damage.

Figure 3A:
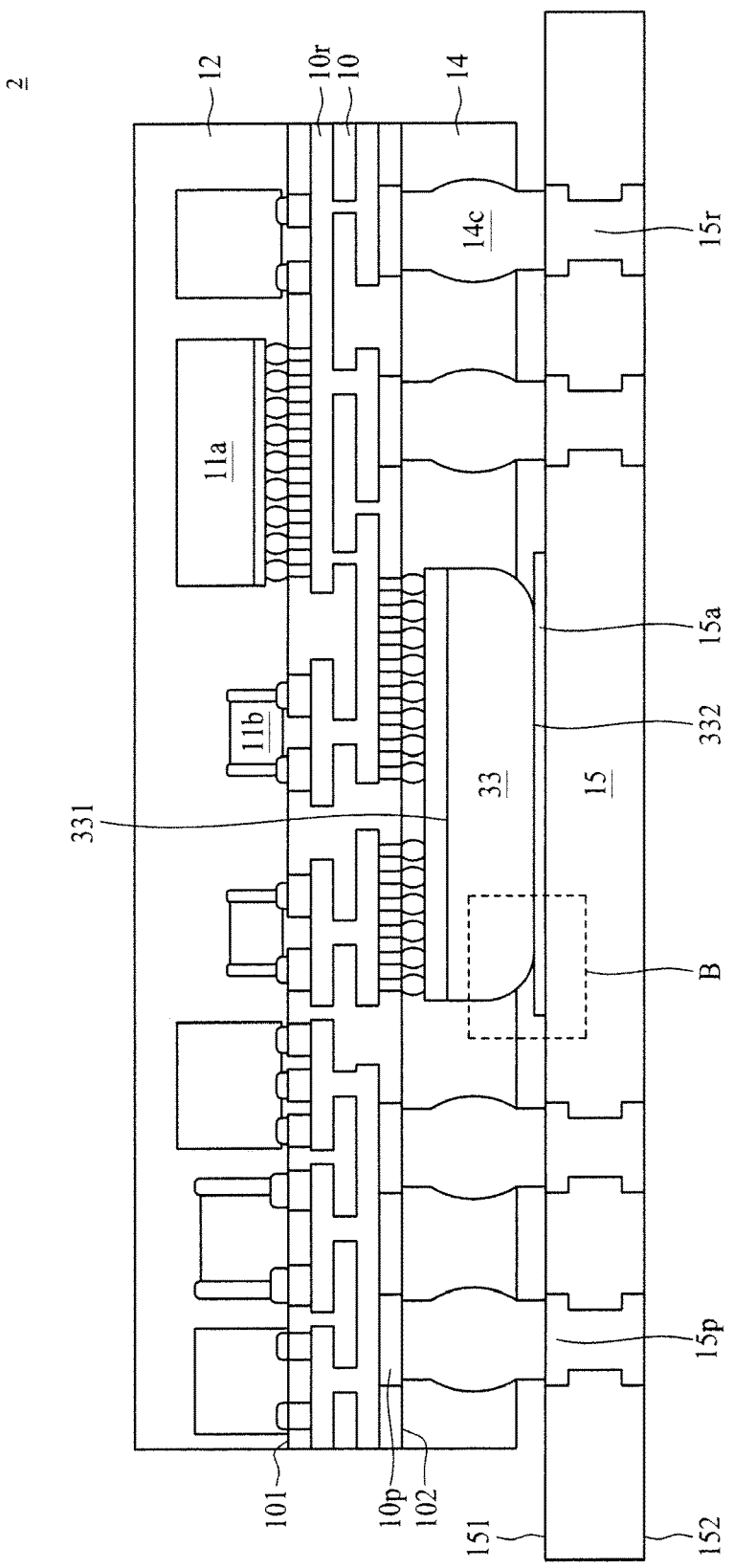
FIG. 3A illustrates a cross-sectional view of some embodiments of a semiconductor package device in accordance with a second aspect of the present disclosure.

FIG. 3A illustrates a cross-sectional view of some embodiments of a semiconductor package device 2 in accordance with some embodiments of the present disclosure. The semiconductor package device 2 is similar to the semiconductor package device 1 shown in FIG. 1A except that it includes an electronic component 33 rather than, or in addition to, the electronic component 13. The electronic component 33 can be similar to the electronic component 13, but may have a different structure. A corner portion B of the electronic component 33 of the semiconductor package device that is identified by a dotted line in FIG. 3A is rounded (e.g. is substantially in the shape of an arc).

Figure 3B:
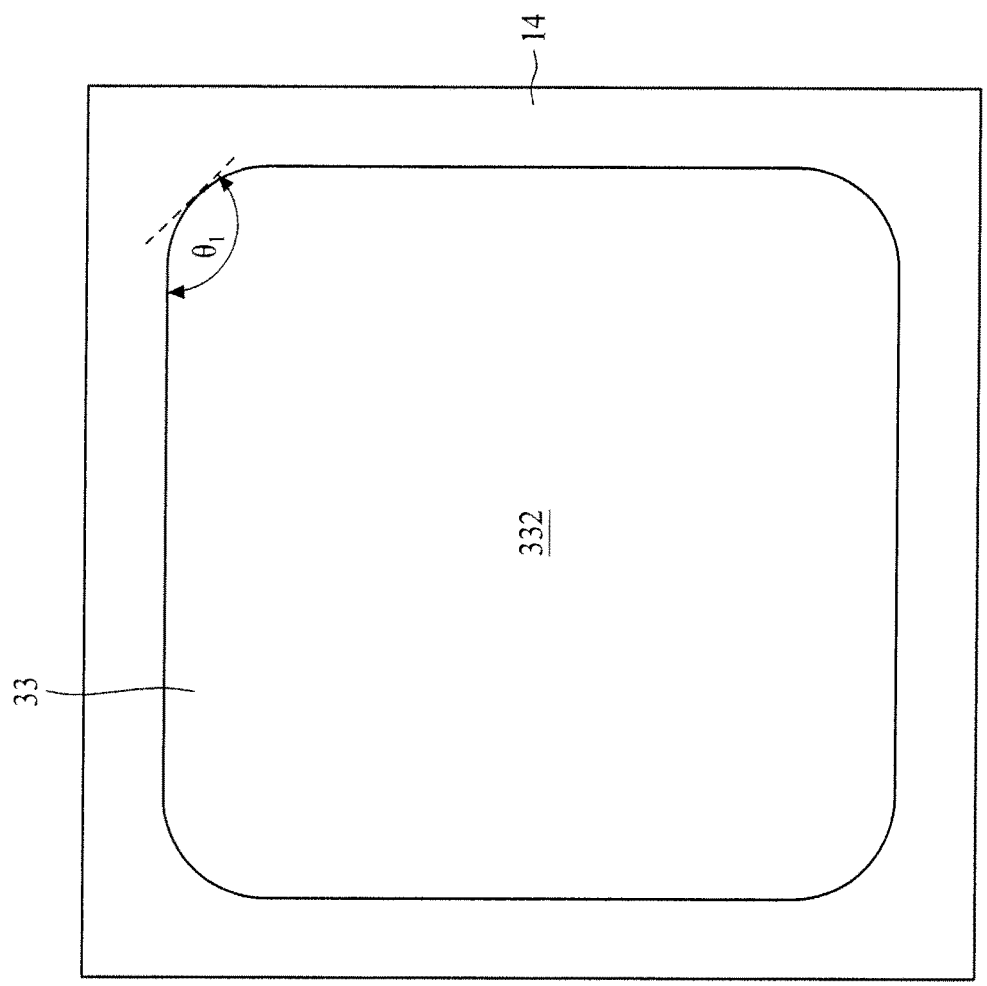
FIG. 3B illustrates a bottom view of the semiconductor package device shown in FIG. 3A in accordance with some embodiments of the present disclosure.

FIG. 3B illustrates a bottom view of the electronic component 33 of the semiconductor package device 2 from the back surface 332 of the electronic component 33 in accordance with some embodiments of the present disclosure.

As shown in FIG. 3B, the back surface 332 of the electronic component 33 has four arc-shaped edges. Each internal angle ($\theta_1$) of the electronic component 33 defined by an edge of the back surface 332 of the electronic component 33 and a tangential line of an adjacent arc-shaped edge is greater than about 90 degrees. In other words, each internal angle ($\theta_1$) of the package body 14 defined by an edge of the back surface 332 of the electronic component 33 and a tangential line of an adjacent arc-shaped edge is greater than about 90 degrees.

Figure 3C:
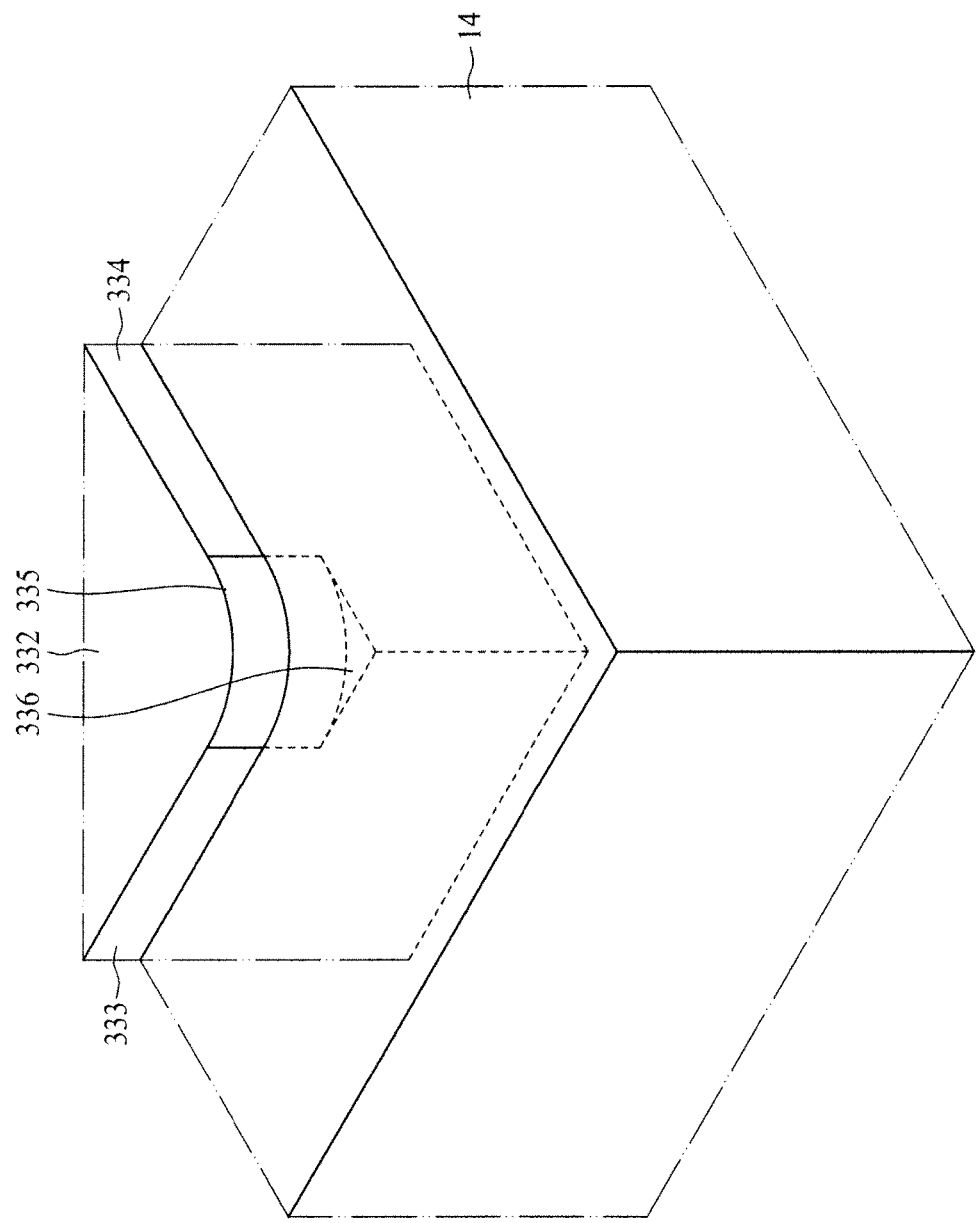
FIG. 3C illustrates a perspective view of an enlarged portion of the semiconductor package device shown in FIG. 3A in accordance with some embodiments of the present disclosure.

FIG. 3C illustrates a perspective view of an enlarged portion B of the semiconductor package device 2 in accordance with some embodiments of the present disclosure. FIG. 3C shows a corner of the electronic component 33.

As shown in FIG. 3C, in addition to the back surface 332, the electronic component 33 has surfaces 333, 334, 335 and 336. The surface 333 is adjacent to the back surface 332 and is substantially perpendicular to the back surface 332. The surface 334 is adjacent to the back surface 332 and is substantially perpendicular to the back surface 332. The surface 335 is adjacent to the back surface 332, is adjacent to and extends between the surface 333 and the surface 334 and is substantially perpendicular to the back surface 332. The surface 336 is adjacent to the surface 335 and is substantially parallel to the back surface 332. In some embodiments, the surfaces 335 and 336 are formed by removing a portion of the corner defined by the surfaces 332, 333 and 334. In some embodiments, the surface 335 is a curved surface (e.g. a curved surface that connects the surface 333 and the surface 334). In some embodiments, the corner of the electronic component 33 may define a recess or a notch.

The package body 14 encapsulates or covers the surface 336 and exposes a portion of the surfaces 333, 334 and 335. For example, an exposed surface of the package body 34 is recessed relative to the back surface 332. In some embodiments, the package body 14 may encapsulate or cover the surface 333, 334, 335 and 336, such that the package body 14 is substantially coplanar with the back surface 332. In some embodiments, an internal angle of a corner of the package body 14 defined by the surfaces 333 and 335 or on the surfaces 334 and 335 is greater than about 90 degrees.

Figure 3D:
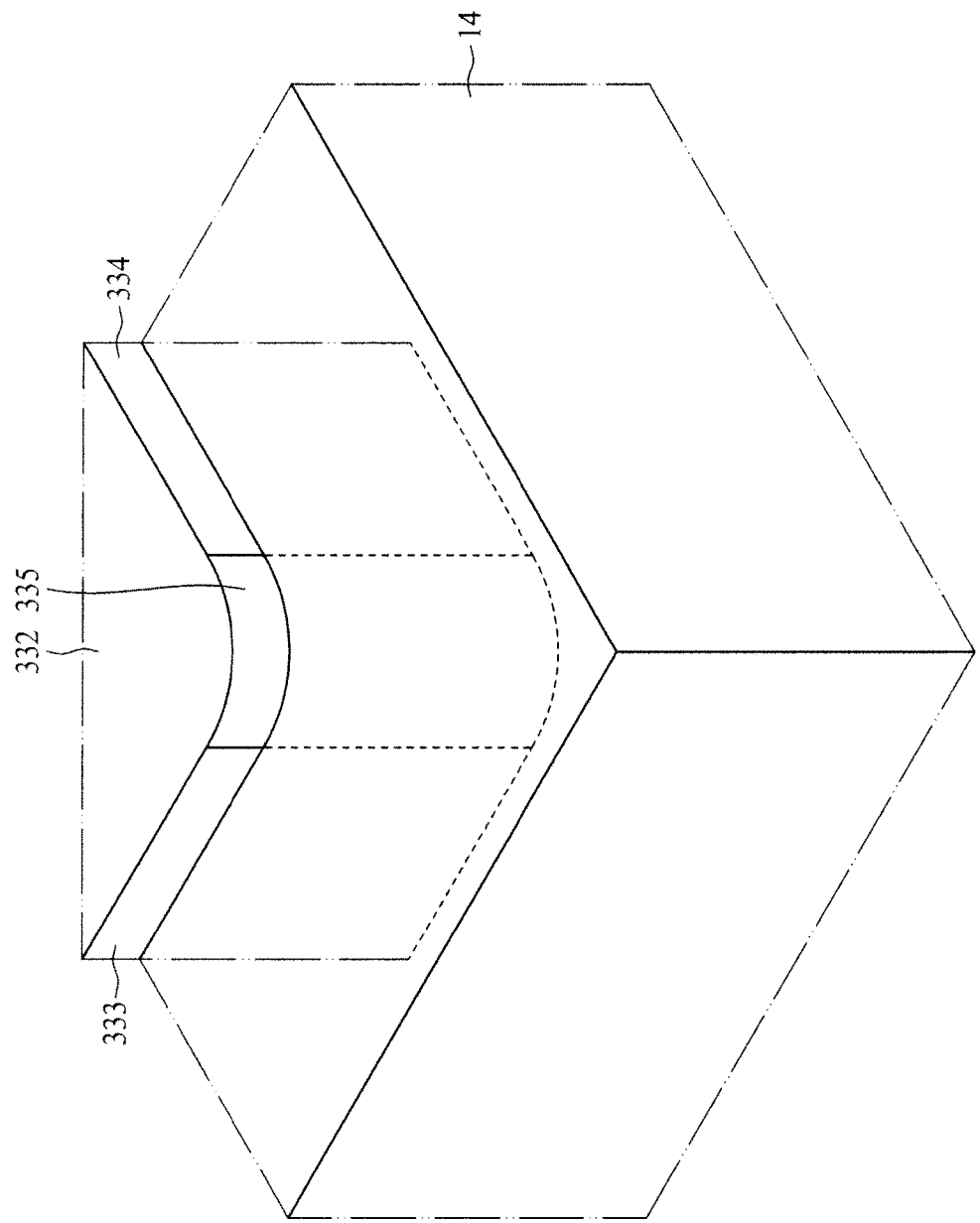
FIG. 3D illustrates a perspective view of an enlarged portion of the semiconductor package device shown in FIG. 3A in accordance with some embodiments of the present disclosure.

FIG. 3D illustrates a perspective view of an enlarged portion B of the semiconductor package device 2 in accordance with some embodiments of the present disclosure. FIG. 3D shows a corner of the electronic component 33. The structure shown in FIG. 3D is similar to that shown in FIG. 3C, except that a right-angled extension at the corner defined by the surfaces 332, 333 and 334 is missing or removed. For example, the surface 335 extends from the back surface 332 to the active surface 331 of the electronic component 33. The structure shown in FIG. 3D omits the surface 336 of the structure shown in FIG. 3C. In some embodiments, the surface 335 is a curved surface.

For the embodiments depicted in FIGS. 3A, 3B, 3C and 3D, the exposed back surface 132 of the electronic component 13 and the corner of the back surface 132 of the electronic component 13 having surfaces that define one or more angles greater than about 90 degrees can provide for a release or redistribution of stress in the package body 14 close to the corner of the electronic component 13, which can help to avoid cracking or other damage.

Figure 4A:
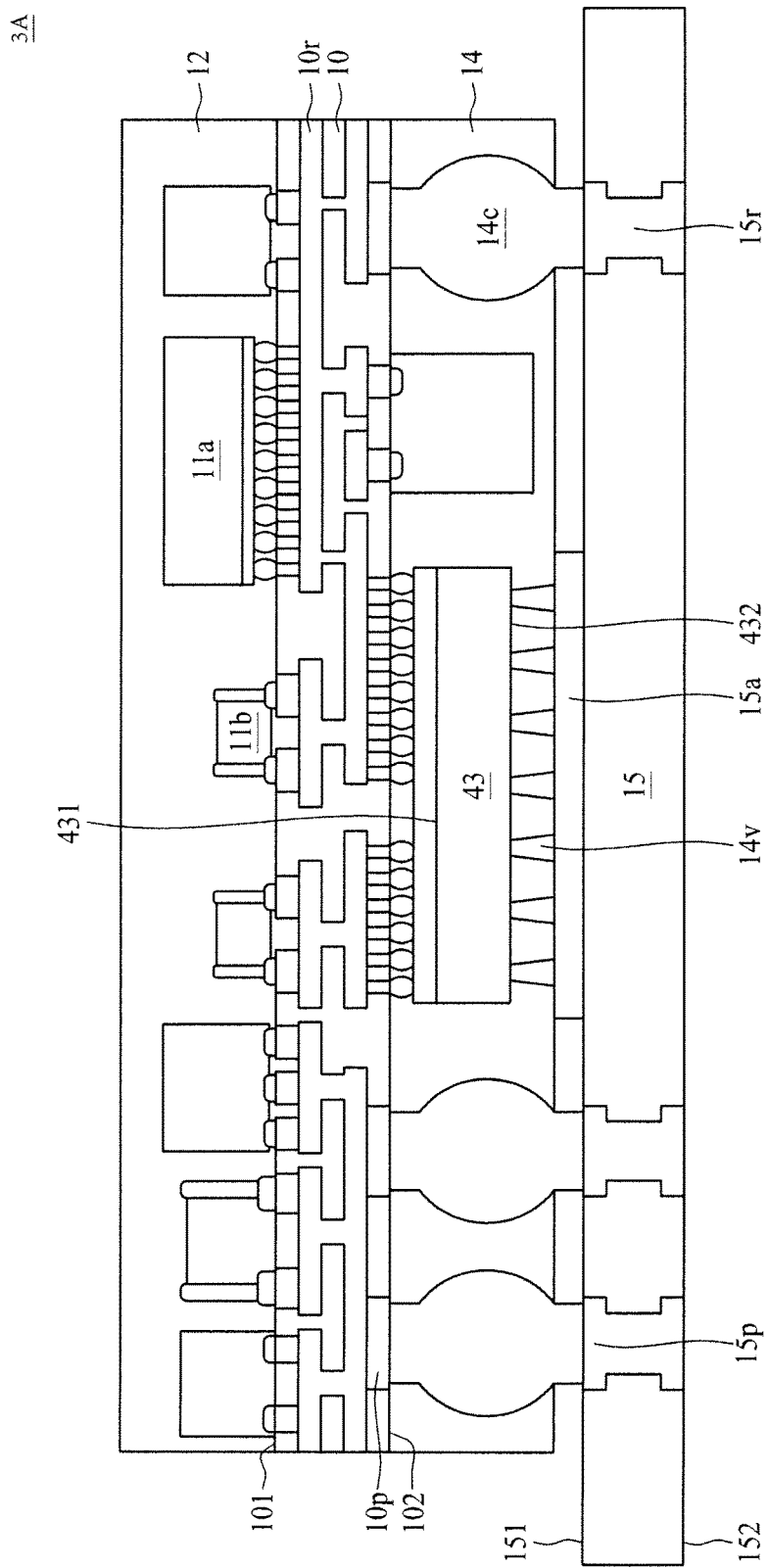
FIG. 4A illustrates a cross-sectional view of some embodiments of a semiconductor package device in accordance with a third aspect of the present disclosure.

FIG. 4A illustrates a cross-sectional view of a semiconductor package device 3A in accordance with some embodiments of the present disclosure. The semiconductor package device 3A is similar to the semiconductor package device 1 shown in FIG. 1A except that it includes an electronic component 43 rather than, or in addition to, the electronic component 13. The electronic component 43 can be similar to the electronic component 13, but may have a different structure. Furthermore, the semiconductor package device 3A may differ from the semiconductor package device 1 shown in FIG. 1A in that a back surface 432 of the electronic component 43 of the semiconductor package device 3A has four edges and that the electronic component 43 is covered or encapsulated by the package body 14 (e.g. is substantially completely covered or encapsulated).

Yet further, the semiconductor package device 3A may differ from the semiconductor package device 1 shown in FIG. 1A in that the semiconductor package device 3A may include a plurality of thermal conductors 14v (e.g. vias filled, at least in part, with thermally conductive material) penetrating the package body 14 to connect the back surface 132 of the electronic component 13 to the TIM 15a. The thermal conductors 14v can provide for transmitting the heat generated by the electronic component 13 to the TIM 15a, thereby increasing heat dissipation of the electronic component 43.

Figure 4B:
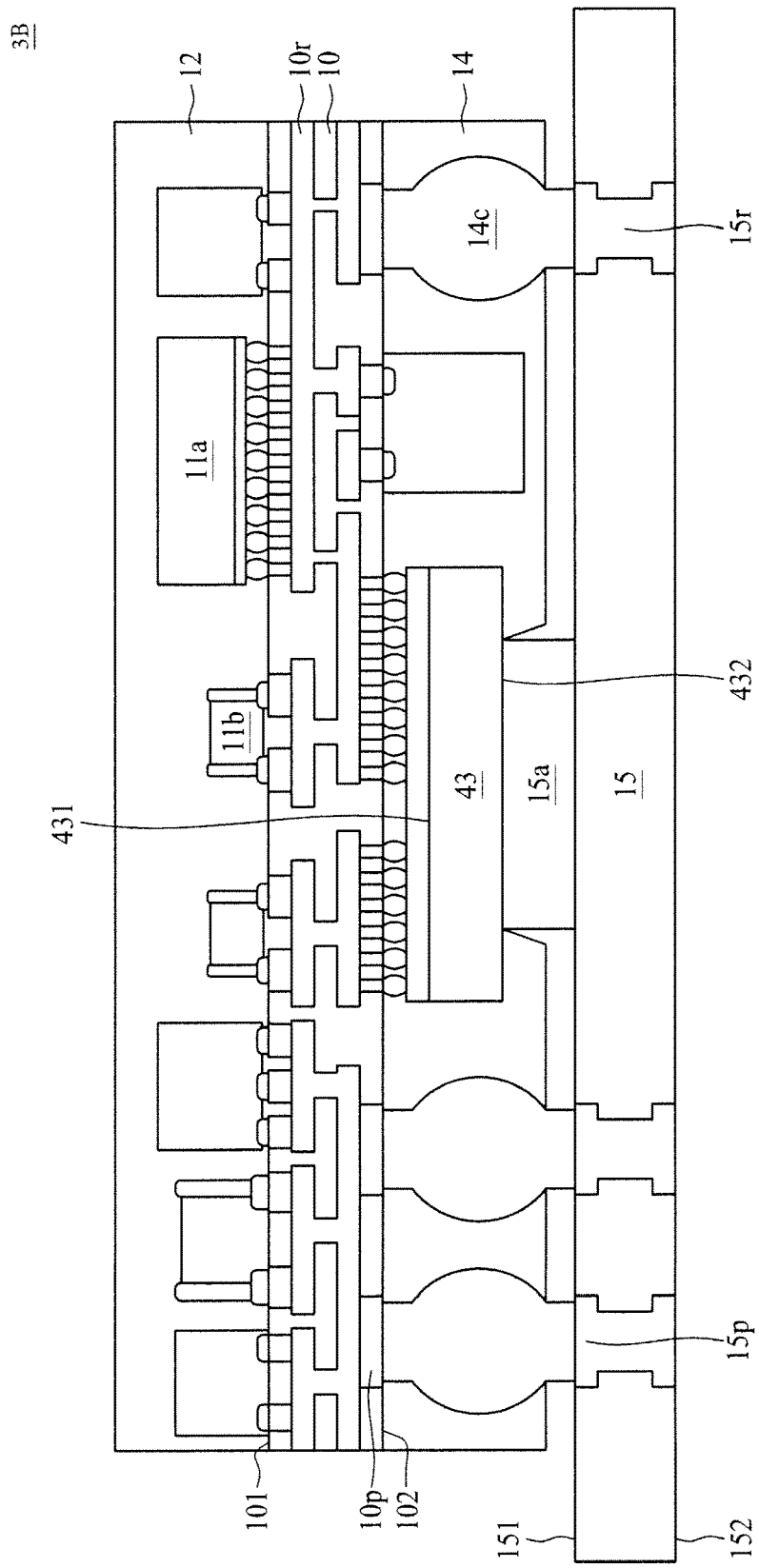
FIG. 4B illustrates a cross-sectional view of some embodiments of a semiconductor package device in accordance with the third aspect of the present disclosure.

FIG. 4B illustrates a cross-sectional view of a semiconductor package device 3B in accordance with some embodiments of the present disclosure. The semiconductor package device 3B is similar to the semiconductor package device 3A shown in FIG. 4A except that the semiconductor package device 3B may omit the thermal conductors 14v.

Yet further, the semiconductor package device 3B may differ from the semiconductor package device 3A shown in FIG. 4A in that a portion of the back surface 432 of the electronic component 43 is exposed from the package body 14. The TIM 15a contacts the exposed portion of the back surface 432 of the electronic component 43 and the carrier 15, which can provide for increased heat dissipation for the electronic component 43. In some embodiments, an area of a top surface of the TIM 15a is less than an area of the back surface 432 of the electronic component 43. In some embodiments, the back surface 432 of the electronic component 43 is exposed (e.g. substantially completely exposed) from the package body 14, and the area of the top surface of the TIM 15a is substantially equal to or greater than the area of the back surface 432 of the electronic component 43.

Figure 5:
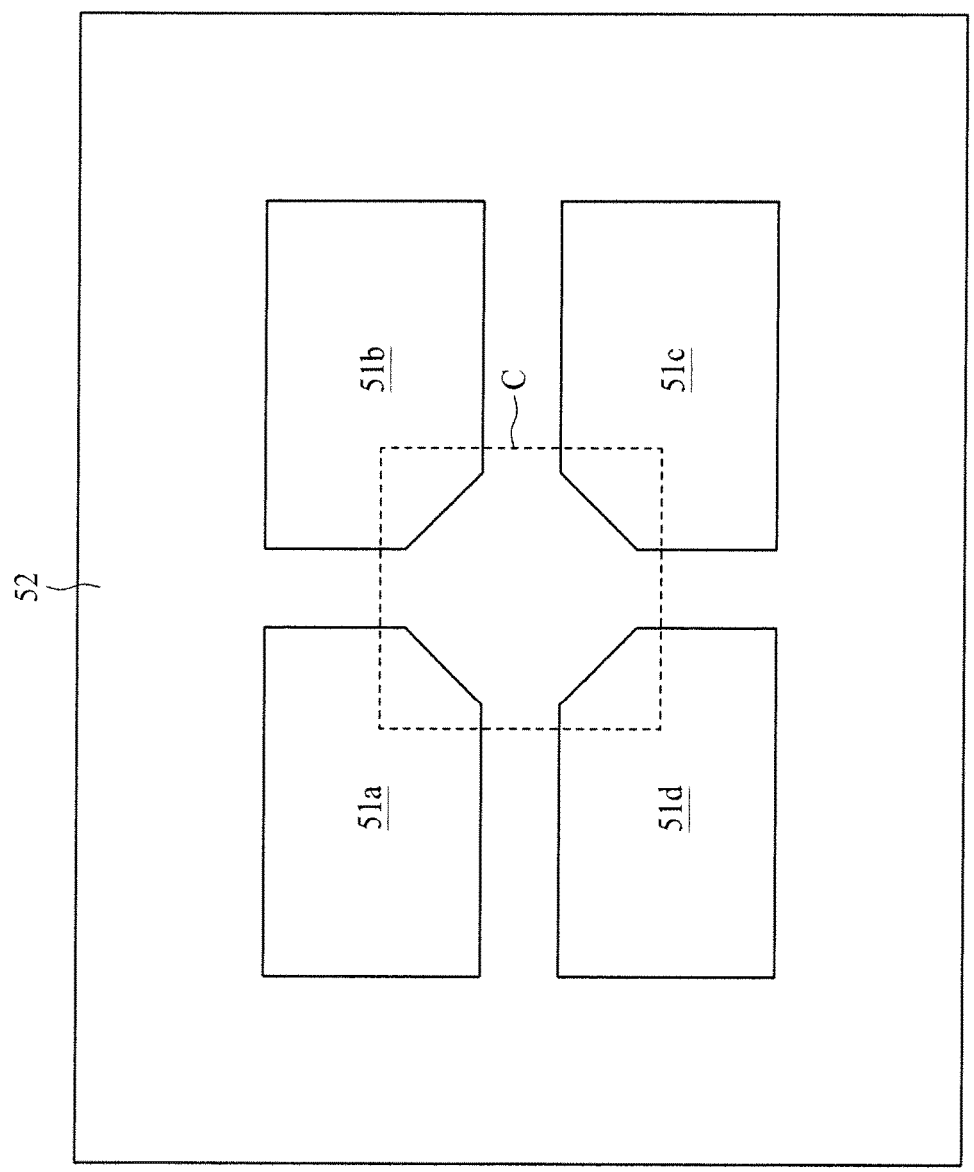
FIG. 5 illustrates a bottom view of some embodiments of a semiconductor package device in accordance with a fourth aspect of the present disclosure.

FIG. 5 illustrates a bottom view of a semiconductor package device 4 in accordance with some embodiments of the present disclosure. The semiconductor package device 4 includes electronic components 51a, 51b, 51c and 51d disposed close together and a package body 52 that covers or encapsulates at least a portion of the electronic components 51a, 51b, 51c and 51d, and thus stress concentration may occur at the region C identified by a dotted line in FIG. 5. Removing a portion of a corner of each electronic component 51a, 51b, 51c and 51d (e.g. removing or omitting a portion of a corner closest to the other electronic components, in any manner described herein, such that any of the electronic component 51a, 51b, 51c and 51d are in accordance with embodiments described herein), as shown in FIG. 5, can help to avoid cracking of the package body 52.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a substrate;
   an electronic component disposed on the substrate, the electronic component having a first surface adjacent to the substrate and a second surface opposite to the first surface, wherein the second surface has at least five edges; and
   a package body encapsulating the electronic component and exposing the second surface of the electronic component.

2. The semiconductor package device of claim 1, wherein at least one internal angle ($\theta$) of the second surface defined by two adjacent edges of the second surface of the electronic component is greater than about 90 degrees.

3. The semiconductor package device of claim 1, wherein at least one internal angle ($\theta$) of a corner of the package body defined by two adjacent edges of the second surface of the electronic component is greater than about 90 degrees.

4. The semiconductor package device of claim 1, wherein
   the electronic component includes a first lateral surface adjacent to the second surface and a second lateral surface adjacent to the second surface and first lateral surface,
   the electronic component further includes a first exposed surface and a second exposed surface, the first exposed surface is substantially perpendicular to the second surface and extends between the first lateral surface and the second lateral surface, and the second exposed surface is substantially parallel to the second surface, and
   a corner of the electronic component is defined by the first lateral surface, the second lateral surface, the second surface, the first exposed surface and the second exposed surface.

5. The semiconductor package device of claim 4, an angle defined by the first exposed surface and any of the first lateral surface and the second lateral surface is greater than about 90 degrees.

6. The semiconductor package device of claim 4, wherein the package body covers at least a portion of the first lateral surface, at least a portion of the second lateral surface, at least a portion of the second exposed surface and at least a portion of the first exposed surface.

7. The semiconductor package device of claim 4, wherein the first exposed surface is a curved surface.

8. The semiconductor package device of claim 1, wherein
   the electronic component includes a first lateral surface adjacent to the second surface and a second lateral surface adjacent to the second surface and first lateral surface,
   the electronic component further includes an exposed surface extending between the first lateral surface and the second lateral surface, and
   a corner of the electronic component is defined by the first lateral surface, the second lateral surface and the exposed surface.

9. The semiconductor package device of claim 8, wherein at least a portion of the exposed surface, at least a portion of the first lateral surface and at least a portion of the second lateral surface are covered by the package body.

10. The semiconductor package device of claim 8, wherein an angle defined by the exposed surface and the first lateral surface or the exposed surface and the second lateral surface is greater than about 90 degrees.

11. The semiconductor package device of claim 8, wherein the exposed surface is a curved surface.

12. The semiconductor package device of claim 8, wherein the exposed surface extends from the second surface to the first surface of the electronic component.

13. A semiconductor package device, comprising:
   a substrate;
   an electronic component disposed on the substrate, the electronic component having a first surface adjacent to the substrate and a second surface opposite to the first surface, wherein at least one angle defined by two adjacent edges of the second surface of the electronic component is greater than about 90 degrees; and
   a package body encapsulating the electronic component and exposing the second surface of the electronic component.

14. The semiconductor package device of claim 13, wherein at least one angle of a corner of the package body defined by two adjacent edges of the second surface of the electronic component is greater than about 90 degrees.

15. The semiconductor package device of claim 13, wherein
   the electronic component includes a first lateral surface adjacent to the second surface and a second lateral surface adjacent to the second surface and the first lateral surface,
   the electronic component further includes a first exposed surface and a second exposed surface, the first exposed surface is substantially perpendicular to the second surface and extends between the first lateral surface and the second lateral surface, and the second exposed surface is substantially parallel to the second surface, and a corner of the electronic component is defined by the first lateral surface, the second lateral surface, the first exposed surface and the second exposed surface.

16. The semiconductor package device of claim 15, wherein an angle defined by the first exposed surface and any of the first lateral surface and the second lateral surface is greater than about 90 degrees.

17. The semiconductor package device of claim 15, wherein the package body covers at least a portion of the first lateral surface, at least a portion of the second lateral surface, at least a portion of the second exposed surface and at least a portion of the first exposed surface.

18. The semiconductor package device of claim 15, wherein the first exposed surface is a curved surface.

19. The semiconductor package device of claim 13, wherein
the electronic component includes a first lateral surface adjacent to the second surface and a second lateral surface adjacent to the second surface and the first lateral surface,
the electronic component further includes an exposed surface extending between the first lateral surface and the second lateral surface, and
a corner of the electronic component is defined by the first lateral surface, the second lateral surface and the exposed surface.

20. The semiconductor package device of claim 19, wherein at least a portion of the exposed surface, at least a portion of the first lateral surface and at least a portion of the second lateral surface are covered by the package body.

21. The semiconductor package device of claim 19, wherein an angle of a corner of the package body defined by the exposed surface and the first lateral surface or the exposed surface and the second lateral surface is greater than about 90 degrees.

22. The semiconductor package device of claim 19, wherein the third exposed surface is a curved surface.

23. The semiconductor package device of claim 19, wherein the exposed surface extends from the second surface to the first surface of the electronic component.

* * * * *